(12) United States Patent
Ito

(10) Patent No.: US 12,404,120 B2
(45) Date of Patent: Sep. 2, 2025

(54) FALL PREVENTION DEVICES AND METHODS

(71) Applicant: ASM IP Holding B.V., Almere (NL)

(72) Inventor: Daisuke Ito, Tama (JP)

(73) Assignee: ASM IP Holding B.V., Almere (NL)

( * ) Notice: Subject to any disclaimer, the term of this patent is extended or adjusted under 35 U.S.C. 154(b) by 900 days.

(21) Appl. No.: 17/577,634

(22) Filed: Jan. 18, 2022

(65) Prior Publication Data

US 2022/0230902 A1    Jul. 21, 2022

Related U.S. Application Data

(60) Provisional application No. 63/139,675, filed on Jan. 20, 2021.

(51) Int. Cl.
*B65G 47/90* (2006.01)

(52) U.S. Cl.
CPC .................. *B65G 47/90* (2013.01)

(58) Field of Classification Search
CPC ......... B65G 47/90; E04G 5/141; E06B 11/00; E06B 11/02; E06B 11/022; E06B 11/027; E06B 11/08
See application file for complete search history.

(56) References Cited

U.S. PATENT DOCUMENTS

| | | | |
|---|---|---|---|
| 4,150,510 A * | 4/1979 | Harrison | ............ E06B 11/00 52/64 |
| 5,546,703 A * | 8/1996 | Conway | ............ E06B 11/00 49/203 |
| 5,592,779 A | 1/1997 | Conway | |
| 5,855,045 A | 1/1999 | Miura | |
| 6,193,459 B1 | 2/2001 | Rush | |
| 6,212,826 B1 | 4/2001 | Kimener | |
| 6,514,022 B2 | 2/2003 | Truckor | |
| 6,837,296 B2 | 1/2005 | Kimener | |
| 6,976,557 B2 * | 12/2005 | Becker | ............ E04G 5/14 182/113 |
| 7,854,092 B2 * | 12/2010 | Stoffels | ............ E06B 11/00 49/109 |
| 8,092,138 B2 | 1/2012 | Duer | |
| 8,944,739 B2 | 2/2015 | Chen | |

(Continued)

FOREIGN PATENT DOCUMENTS

| | | |
|---|---|---|
| CN | 201927583 U | 8/2011 |
| TW | 201212147 A | 3/2012 |

*Primary Examiner* — Johnnie A. Shablack
(74) *Attorney, Agent, or Firm* — Snell & Wilmer L.L.P.

(57) ABSTRACT

A gate/barrier assembly includes a first post, a second post, a gate, and a barrier. The first post is arranged to be fixedly supported by a semiconductor processing system. The second post extends in parallel with the first post and is arranged to be pivotably supported by the semiconductor processing system. The gate is pivotably supported by the first post and has a closed position where the gate overlaps the second post and an open position wherein is the gate is spaced apart from the second post. The barrier is fixedly supported by the second post, has guard and guide positions, is spaced apart from the first post in the guide position, and abuts the first post in the guard position. The gate overlaps the barrier when the gate is in the closed position and the barrier is in the guard position.

20 Claims, 12 Drawing Sheets

(56) References Cited

U.S. PATENT DOCUMENTS

| | | | | |
|---|---|---|---|---|
| 9,027,712 B2* | 5/2015 | Melton | ............... | B65G 69/22 |
| | | | | 182/36 |
| 10,519,014 B2 | 12/2019 | Conway | | |
| 10,697,236 B2 | 6/2020 | King | | |
| 11,761,217 B2* | 9/2023 | Curtis | ............... | E04G 5/145 |
| | | | | 182/113 |
| 2019/0161980 A1* | 5/2019 | Walker, II | ............... | E04G 1/24 |
| 2024/0091989 A1* | 3/2024 | Møller | ............... | E04G 5/141 |

* cited by examiner

FALL PREVENTION DEVICES AND METHODS

CROSS-REFERENCE TO RELATED APPLICATIONS

This application claims the benefit of and priority to U.S. Provisional Patent Application Ser. No. 63/139,675 filed Jan. 20, 2021, the disclosure of which is hereby incorporated by reference in its entirety.

FIELD OF THE DISCLOSURE

The present disclosure generally relates to fall prevention. More particularly, the present disclosure relates to preventing falls from semiconductor processing systems, such as during the installation and/or removal of modules from semiconductor processing systems.

BACKGROUND OF THE DISCLOSURE

Semiconductor process tools, such as semiconductor process tools used to fabricate semiconductor devices on silicon wafers, commonly employ substrate handling modules and processing modules to manipulate and process silicon substrates. The substrate handling modules generally transfer wafers into the out of the process tool and/or among processing modules of the semiconductor process tool. The processing modules typically form features on the substrates to fabricate the semiconductor device, such as by depositing films onto substrates and/or by etching substrates.

Sometimes, it may be necessary to remove and replace a module in a semiconductor process tool. For example, in some semiconductor processing systems, it may be necessary to remove and replace a module to add new capability to the semiconductor process tool. Alternatively (or additionally), it may be necessary to remove and replace a module for reliability or availability reasons, such as in the unlikely event of a failure. Removal and replacement events may, in some semiconductor process tools, require that technician(s) work from elevated workspaces during the removal and replacement event. Such work may expose the technician(s) to risk of injury in the event of fall from the elevated workspace.

Various devices exist to limit the risk of injury from falls from elevated workspaces. For example, safety railings may be positioned in and around elevated workspace. Safety netting may be positioned around elevated workspaces. And safety tie-offs distributed within the elevated workspace may cooperate with safety harnesses worn by technicians doing work from elevated workspaces to limit risk of injury in the event of fall from the elevated workspace.

Such fall prevention devices and fall prevention methods have generally be acceptable for their intended purpose. However, there remains a need in the art for improved fall prevention devices and methods of preventing falls from elevated workspaces. The present disclosure provides a solution to this need.

SUMMARY OF THE DISCLOSURE

A gate/barrier assembly for a semiconductor processing system is provided. The gate/barrier assembly includes a first post configured to be fixedly supported by a semiconductor processing system; a second post extending in parallel with the first post and configured to be pivotably supported by the semiconductor processing system; a gate pivotably supported by the first post and having a closed position and an open position, the gate overlapping the second post in the closed position, the gate spaced apart from the second post in the open position; and a barrier fixedly supported by the second post and having a guard position and a guide position, the barrier abutting the first post in the guard position, the barrier spaced apart from first post in the guide position. The gate overlaps the barrier when the gate is in the closed position and the barrier is in the guard position.

In certain examples, the gate/barrier assembly may include a biasing member arranged between the gate and the first post. The biasing member may urge the gate toward the closed position to automatically move the gate between the closed position and the open position.

In certain examples, the gate/barrier assembly may have a first post flange. The first post flange may extend about the first post to fixedly support the first post adjacent to a passthrough of the semiconductor processing system.

In certain examples, the gate/barrier assembly may have a second post flange. The second post flange may extend about the second post to pivotably support the second post opposite the first post. The second post may be spaced from the first post by a passthrough of the semiconductor processing system.

In certain examples, the gate/barrier assembly may include a gate midrail. The gate midrail may extend horizontally relative to the first post. The gate midrail may be spaced from the semiconductor processing system by less than 500 millimeters (about 19.7 inches). A gate toprail may extend in parallel with the gate midrail. The gate toprail may be spaced from the gate midrail by less than 500 millimeters (about 19.7 inches).

In certain examples, the gate may include an inboard portion and an outboard portion. The inboard portion may be pivotably supported by the first post. The outboard portion may be pivotably supported by the inboard portion of the gate and therethrough by the first post. The outboard portion of the gate may have an extended position and a folded position, the outboard portion of the gate abutting the inboard portion of the gate in extended position, the outboard portion of the gate overlaying the inboard portion of the gate in the folded position.

In certain examples, the gate/barrier assembly may include a barrier midrail. The barrier midrail may be fixed to the second post. The barrier midrail may extend horizontally from the second post. The barrier midrail may be spaced from the semiconductor processing system by less than 500 millimeters (about 19.7 inches). A barrier toprail may be fixed to the second post. The barrier toprail may extend in parallel with the barrier midrail. The barrier toprail may be spaced from the barrier midrail by less than 500 millimeters (about 19.7 inches).

In certain examples, the gate/barrier assembly may include a first bracket. The first bracket may be fixed to the semiconductor processing system. The bracket may define therein two or more first bracket fastener apertures. The two or more first post fasteners may extend through the two or more first bracket fastener apertures. The two or more first post fasteners may fix the first post to the first bracket.

In certain examples, the gate/barrier assembly may include a second bracket. The second bracket may be fixed to the semiconductor processing system. The second bracket may define therein two or more second bracket fastener apertures. Two or more second post fasteners may extend through the two or more second bracket fastener apertures. The two or more second post fasteners may fix the second post to the second bracket.

In certain examples, the number of second bracket fastener apertures may be greater than the number of second post fasteners to pivotably fix the barrier to the semiconductor processing system for moving the barrier between the guard position and the guide position.

In certain examples, the number of second post threaded apertures may be greater than the number of second post fasteners to pivotably fix the barrier to the semiconductor processing system for moving the barrier between the guard position and the guide position.

In certain examples, the gate/barrier assembly may include a latch member. The latch member may be fixed to one of the barrier and the gate to fix the gate to the barrier when the gate is in the closed position.

In certain examples, the gate may overlap an inboard facing surface of the second post when in the closed position. The barrier may abut a surface of the first post facing the second post when in the closed position.

In certain examples, the gate may be fixed to the barrier when the barrier is in the guard position. The gate may be fixed to the barrier when the barrier is in the guide position.

In certain examples, the gate/barrier assembly may include a hinge. The hinge may connect the gate to the first post. A biasing member may be arranged between the gate and the first post. The biasing member may be configured to urge the gate toward the closed position. A catch mechanism may be operably associated with the hinge and configured to retain the gate in the open position.

A semiconductor system is provided. The semiconductor processing system includes a wafer handling chamber, a wafer handler, and a gate/barrier assembly as described above. The wafer handling chamber is positioned above a floor and has a workspace and a passthrough that are elevated relative to the floor. The wafer handler is be housed within the wafer handling chamber. The first post of the gate/barrier assembly is fixed to the wafer handling chamber, the second post of gate/barrier assembly is pivotably fixed to the wafer handling chamber, and the second post is spaced from the first post by the passthrough. The gate of the gate/barrier assembly spans the passthrough in the closed position and the barrier of the gate/barrier assembly spans the passthrough in the guard position.

In certain examples, the gate of the gate/barrier assembly may extend inboard from the passthrough in the open position. The barrier of the gate/barrier assembly may extend outboard from the passthrough in the guide position.

In certain examples, the semiconductor processing system may include a staircase. The staircase may be connected to the wafer handling chamber to provide access to the workspace from the floor. A rail may extend above the wafer handling chamber. The rail may be supported by the wafer handling chamber. The rail may extend above the passthrough between an inboard hoisting location and an outboard hoisting location. A trolley-mounted hoist may be slidably disposed along the rail for transfer of the wafer handler module into and from the workspace.

A method of removing and replacing a module in a semiconductor processing system is provided. The method includes, at a semiconductor processing system including a gate/barrier assembly as described above, hoisting a wafer handler module from the semiconductor processing system. The gate of the gate/barrier assembly is moved to the open position, the barrier of the gate/barrier assembly is moved to the guide position; and the wafer handler module is transferred through the passthrough of the semiconductor processing system. The gate of the gate/barrier assembly automatically moves to the closed position as the wafer handler module traverses the passthrough.

In certain examples, the method may include removably fixing the gate to the barrier while the gate is in the closed position and the barrier is in the guide position.

In certain examples, the method may include moving the gate from the open position by releasing a catch mechanism operably associated with the gate.

In certain examples, the method may include moving an outboard portion of the gate from an extended position to a folded position. Once in the folded position, a chamber lid may be transferred through space previously occupied by the outboard portion in the extended position.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the present disclosure herein are described below with reference to the drawings of certain embodiments, which are intended to illustrate and not to limit the present disclosure.

Figure 10:
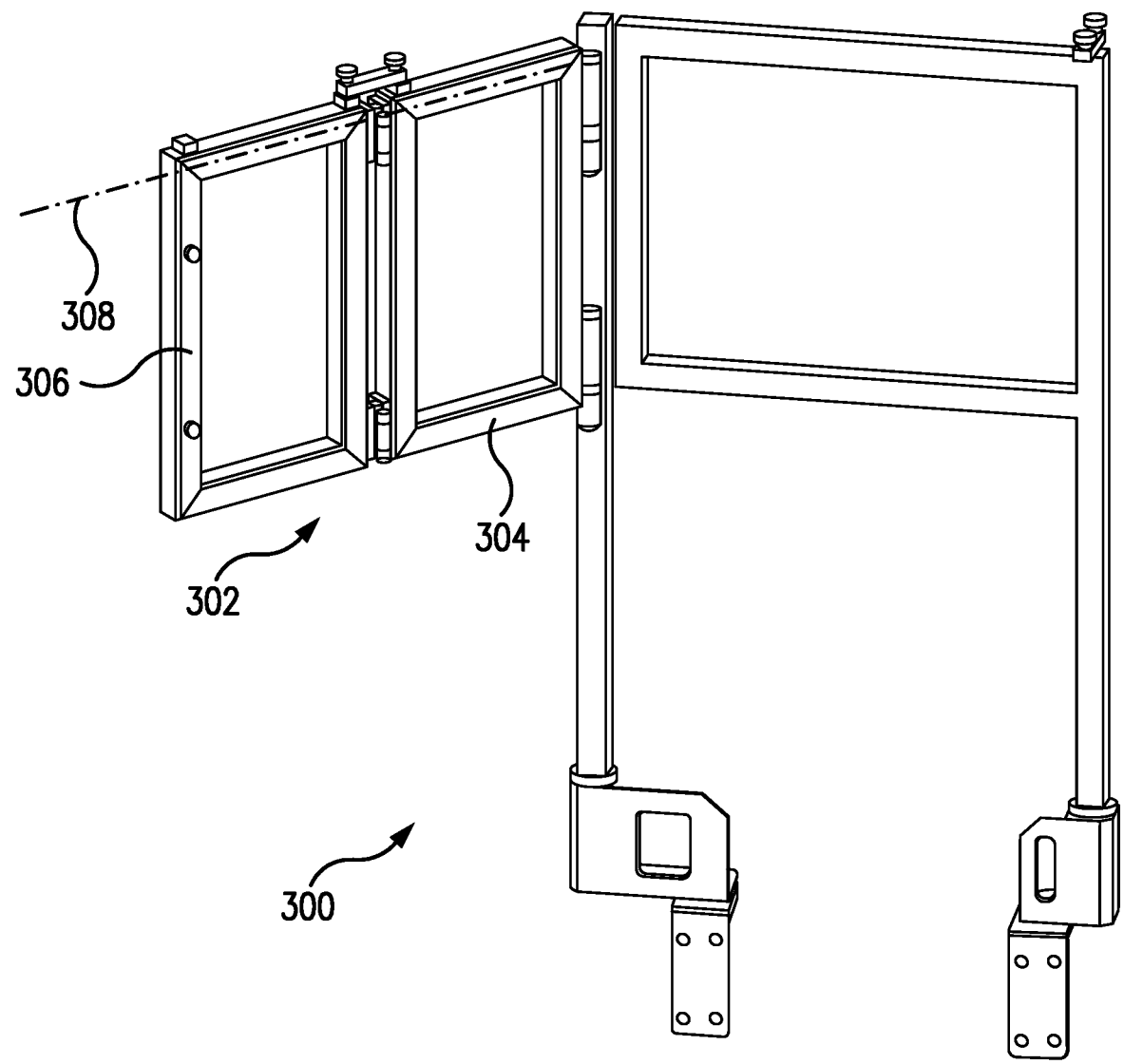
Figure 11:
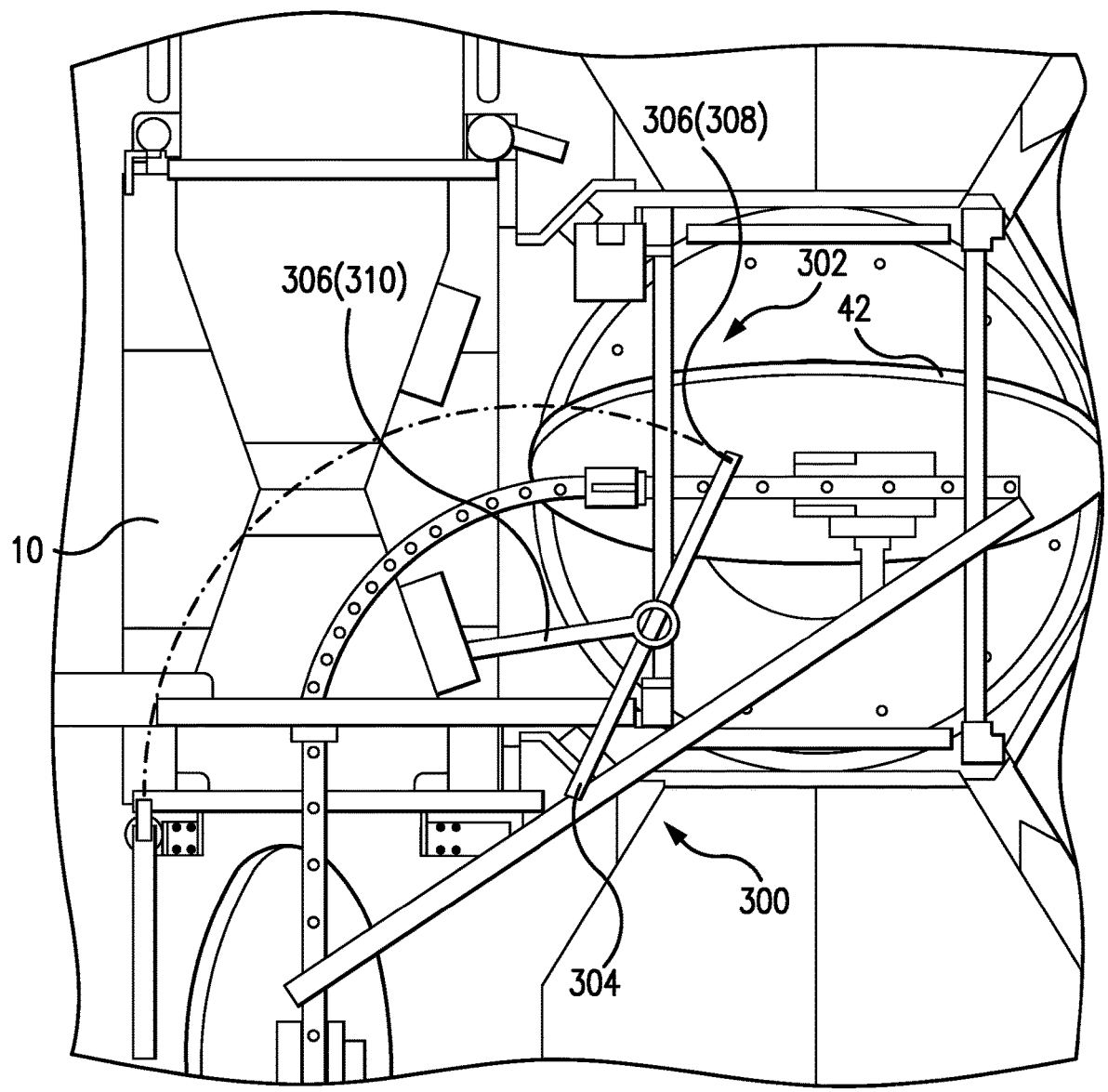
Figure 12:
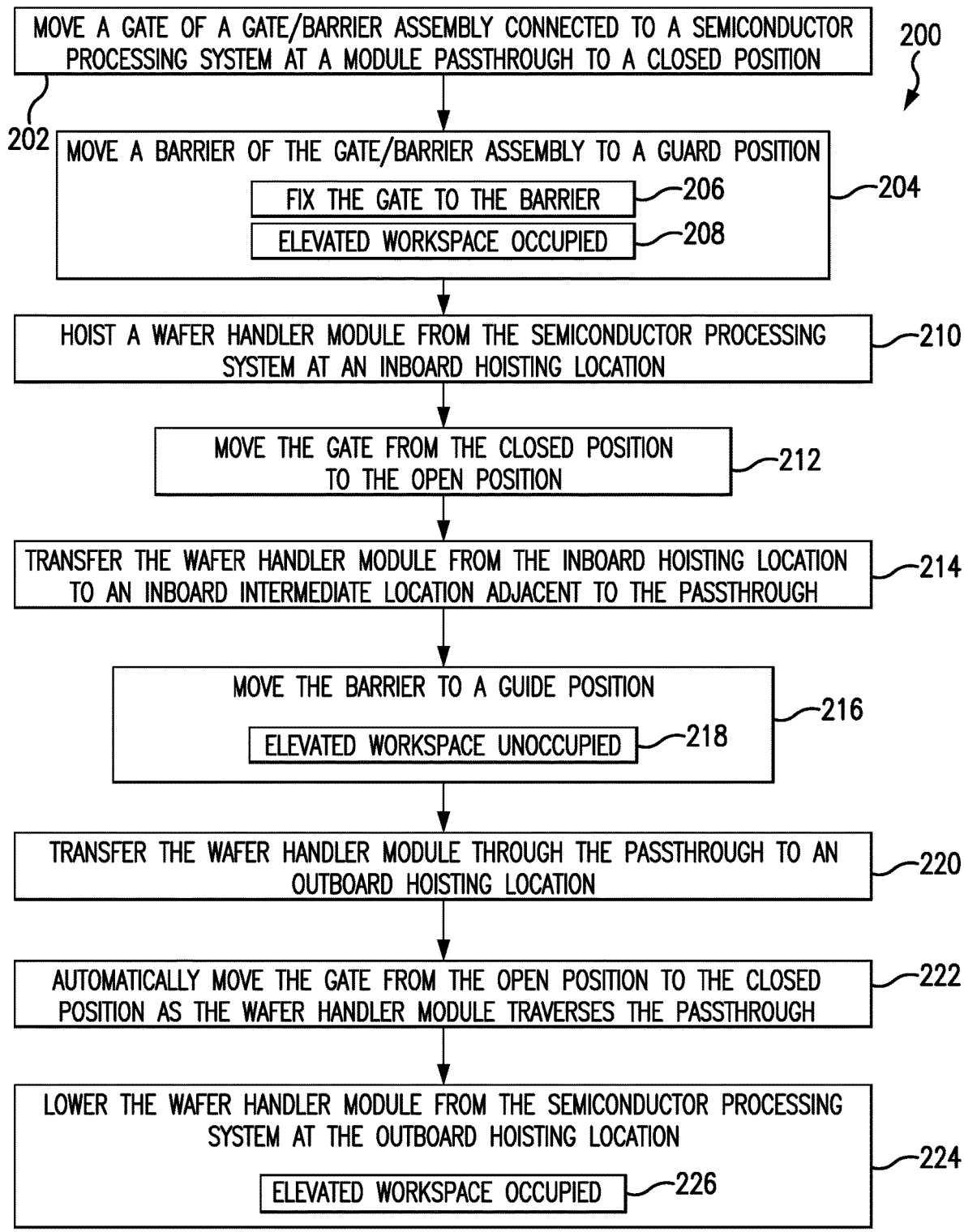

FIGS. 10 and 11 are perspective and plan views of the gate/barrier assembly according to another example the present disclosure, showing a split gate in an extended position and a folded position during removal of a cover overlaying the wafer handling module, respectively; and FIG. 12 is a block diagram of a method of removing and replacing a module in a semiconductor processing system, showing operations of the method according to an illustrative and non-limiting example of the method.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
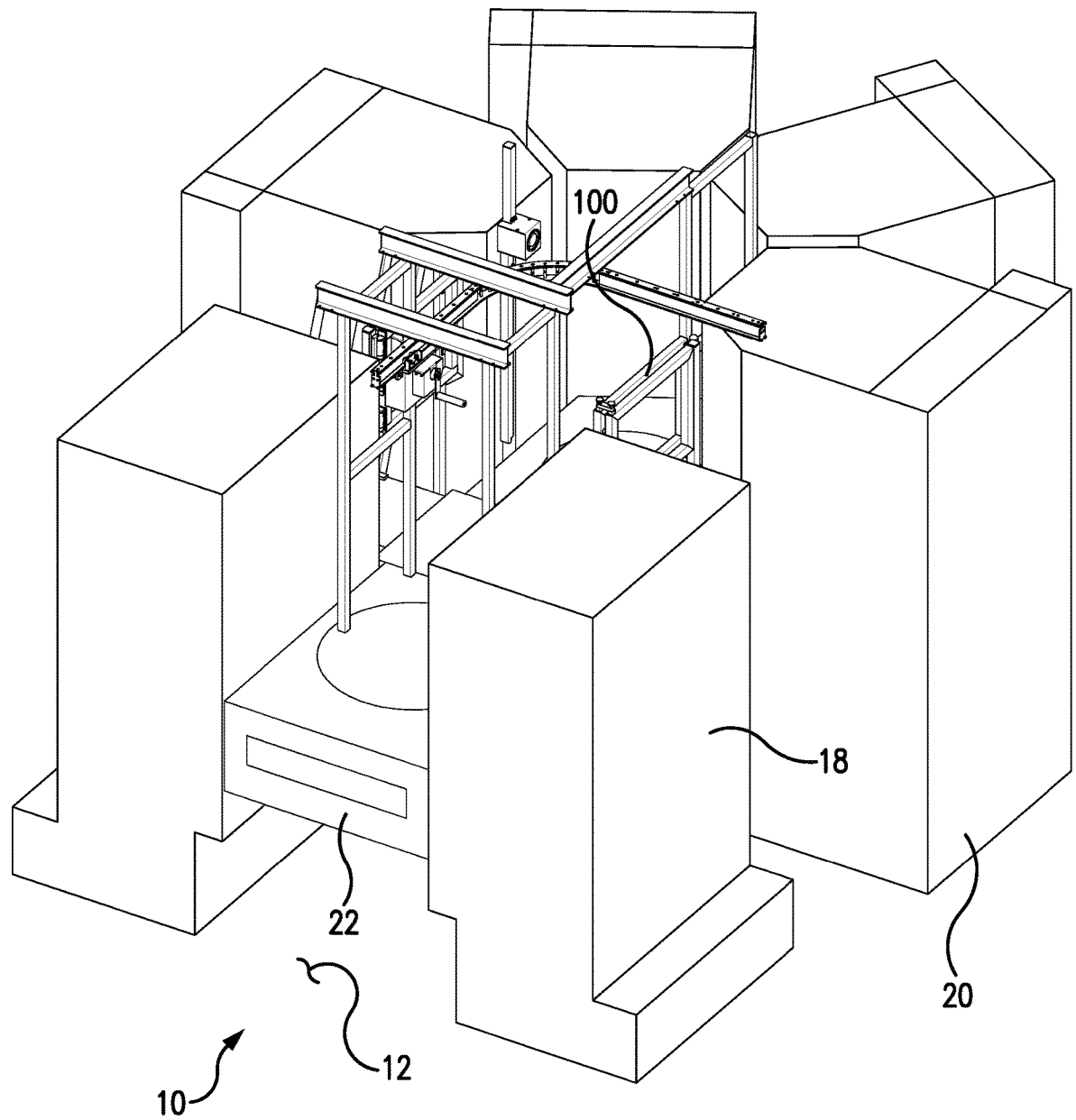
FIG. 1 is a perspective view of a semiconductor processing system having an elevated workspace and a module passthrough, showing a gate/barrier assembly connected to the semiconductor processing system at the passthrough to prevent falls from the elevated workspace.

Reference will now be made to the drawings wherein like reference numerals identify similar structural features or aspects of the subject disclosure. For purposes of explanation and illustration, and not limitation, a partial view of an example of a gate/barrier assembly in accordance with the disclosure is shown in FIG. 1 and is designated generally by reference character 100. Other embodiments of gate/barrier assemblies, semiconductor processing systems including gate/barrier assemblies, and methods of removing and replacing modules in semiconductor processing systems in accordance with the present disclosure, or aspects thereof, are provided in FIGS. 2-12, as will be described. The systems and methods described herein may be used for to prevent falls from elevated workspaces during installation and/or replacement of modules in semiconductor processing systems, such as during installation and/or replacement of wafer handler modules in chemical vapor deposition (CVD) and atomic layer deposition (ALD) semiconductor processing systems, though the present disclosure is not limited to wafer handler modules or to any particular type of semiconductor processing system in general.

Referring to FIG. 1, a semiconductor processing system 10 is shown. The semiconductor processing system 10 is arranged on a floor 12, e.g., in a cleanroom, and includes a wafer handling chamber 14, a wafer handler module 16 (shown in FIG. 5), a first processing module 18, and one or more second processing module 20. The wafer handling chamber 14 is supported above the floor 12, houses the wafer handler module 16 and includes a gate valve 22. The gate valve 22 is configured to transfer substrates, e.g., silicon wafers, into and out of the semiconductor processing system 10 via the wafer handling chamber 14.

The wafer handler module 16 (shown in FIG. 5) is configured to transfer wafers between the gate valve 22, the first processing module 18, and/or the one or more second processing module 20. In certain examples, the wafer handler module 16 may be a first wafer handler module 16 and the semiconductor processing system 10 may include a second wafer handler module 40 housed within the wafer handling chamber 14. For example, the first wafer handler module 16 may be a front-end wafer handler module and the second wafer handler module 40 may be a back-end wafer handler module. A loadlock module may be arranged between the first wafer handler module 16 and the second wafer handler module 40.

Figure 5:
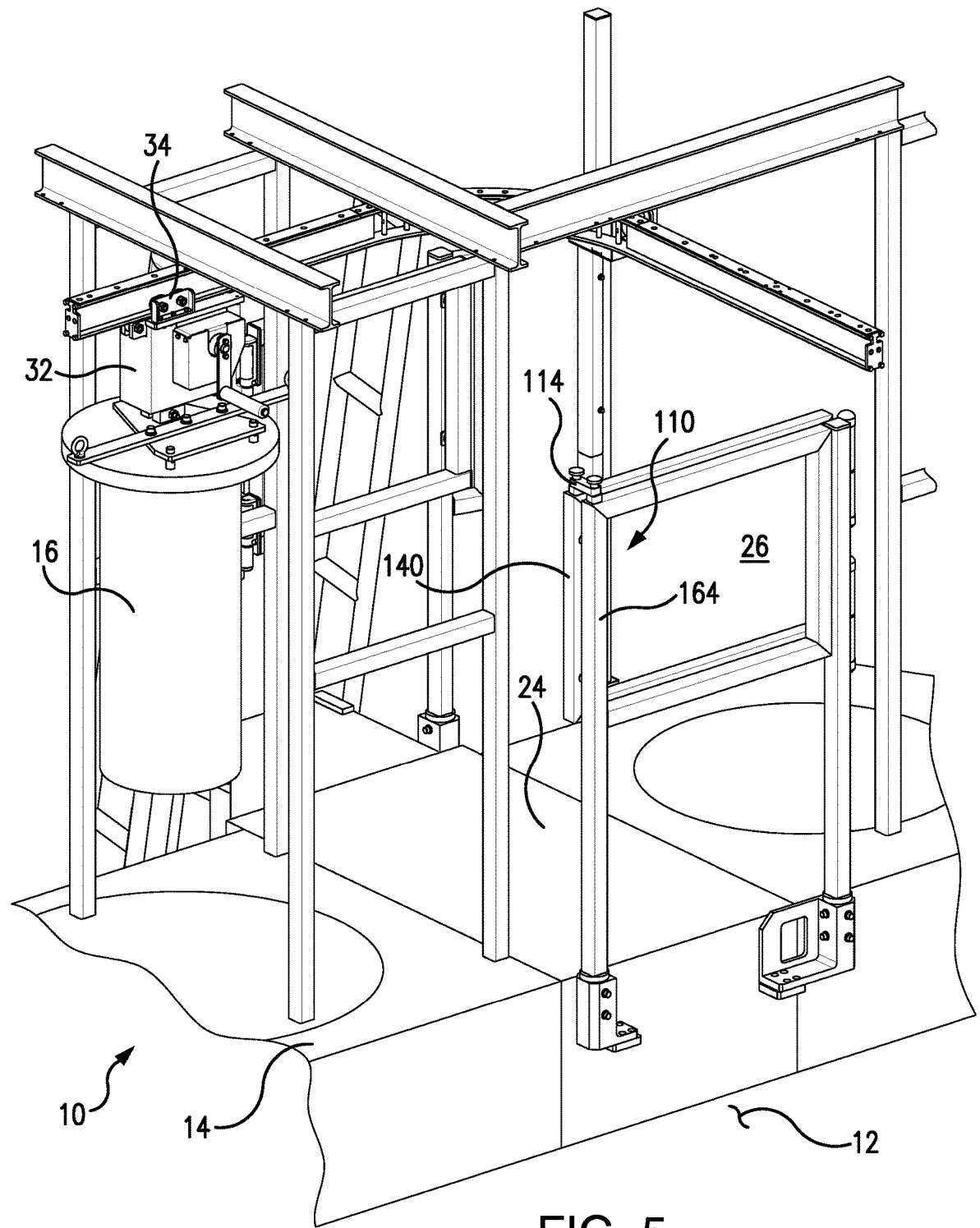
FIG. 5 is a perspective view of a portion of the semiconductor processing system of FIG. 1 including the gate/barrier assembly, showing a wafer handler module being hoisted from the semiconductor processing system while the gate and the barrier span the passthrough in the closed position and the guard position, respectively.

The first processing module 18 and the one or more second processing module 20 are configured for depositing films and/or etching substrates received from the wafer handler module 16 (shown in FIG. 5). In this respect the first processing module 18 and the one or more second processing module 20 are arranged on the floor 12, abut the wafer handling chamber 14, and are laterally adjacent to one another. In certain examples, at least one of the first processing module 18 and second processing module 20 may be a CVD processing module. In accordance with certain examples, at least one of the first processing module 18 and the second processing module 20 may be an ALD processing module. In the illustrated example the semiconductor processing system has eight (8) processing modules. This is for illustration purposes and is non-limiting. As will be appreciated by those of skill in the art in view of the present disclosure, semiconductor processing systems having fewer than eight (8) processing modules or more than eight (8) processing modules may also benefit from the present disclosure.

Figure 2:
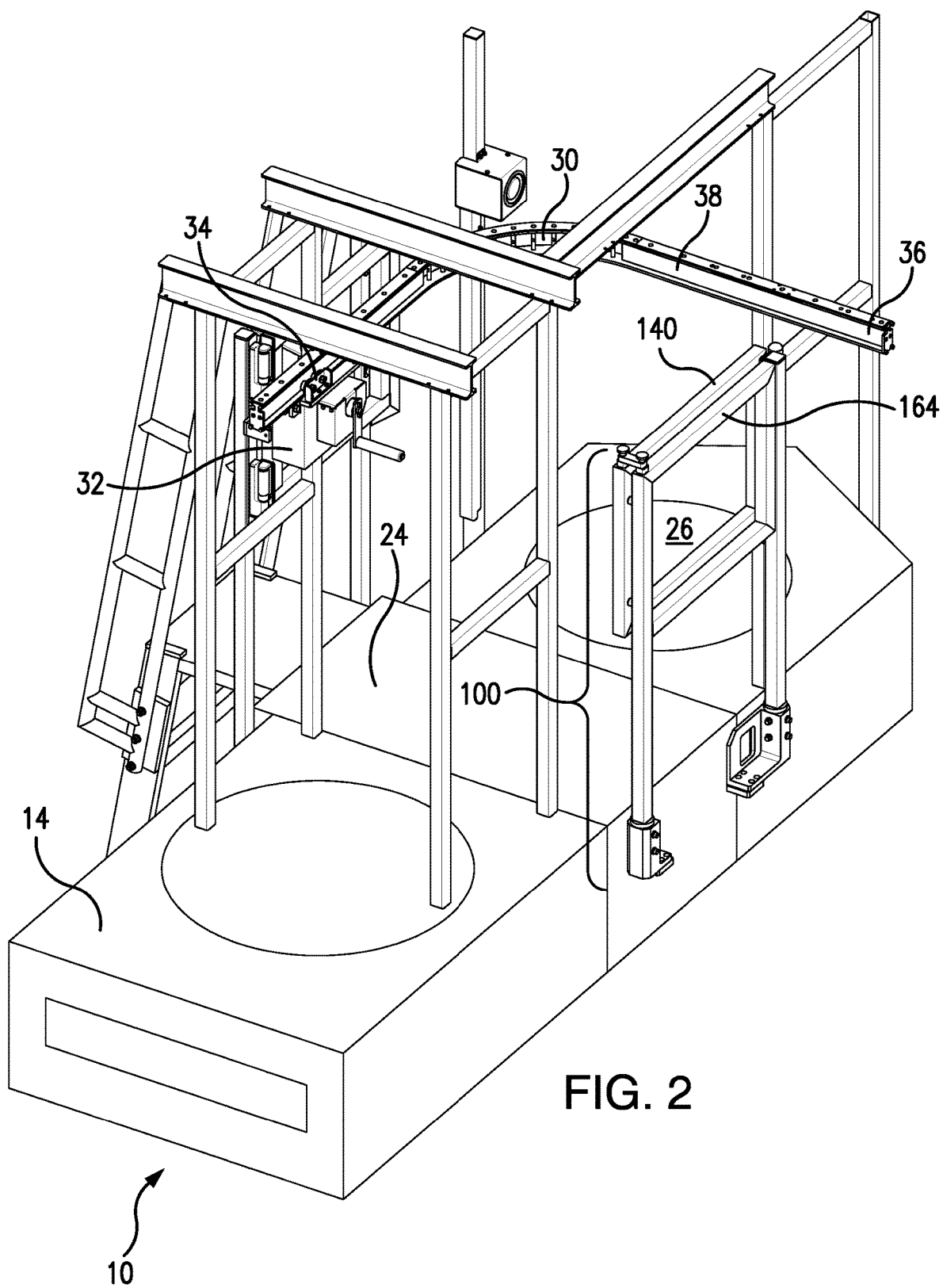
FIG. 2 is a perspective view of a portion of the semiconductor processing system of FIG. 1 including the gate/barrier assembly, showing a gate and a barrier of the gate/barrier assembly spanning the passthrough in a closed position and a guard position, respectively.

With reference to FIG. 2, as has been explained above, it may sometimes be necessary to install/replace modules from a semiconductor processing system, e.g., the wafer handler module 16 (shown in FIG. 5), such as to upgrade or repair a module of the semiconductor processing system. To facilitate installation/removal of the wafer handler module 16 the semiconductor processing system 10 has a workspace 24 and a passthrough 26, and includes a staircase 28, a rail 30, and a trolley-mounted hoist 32. The workspace 24 is defined along the top of the wafer handling chamber 14 and is located above the wafer handler module 16. The workspace 24 extends between an inboard hoisting location 34 and an outboard hoisting location 36, and traverses the passthrough 26. It is contemplated that the workspace 24 be further accessible by technicians through the staircase 28, which is supported by the wafer handling chamber 14 to provide access to the workspace 24 for technicians from the floor 12.

The passthrough 26 is located within a gap defined between the first processing module 18 (shown in FIG. 1) and the second processing module 20 (shown in FIG. 1), is elevated with respect to the floor 12, and separates the inboard hoisting location 34 from an outboard hoisting location 36 located above the floor 12. The elevated workspace 24 extends along an upper surface of the wafer handling chamber 14 to the passthrough 26, both the elevated workspace 24 and the passthrough 26 being elevated relative to the floor 12. The rail 30 is supported above the semiconductor processing system 10, e.g., by frames extending upwards from and supported by the wafer handling chamber 14 and spans an upper surface of the wafer handling chamber 14 between the inboard hoisting location 34 and the outboard hoisting location 36. The trolley-mounted hoist 32 is slidably disposed along the rail 30, carries a hoisting mechanism thereon for hoisting and lowering the wafer handler module 16, and is movable along the rail 30 between the inboard hoisting location 34 and the outboard hoisting location 36. In certain example, the workspace 24 may be elevated above the floor 12 by a height sufficient to invoke the safeguard prescribed in SEMI S2-0818, ENVIRONMENTAL, HEALTH, AND SAFETY GUIDELINE FOR SEMICONDUCTOR MANUFACTURING EQUIPMENT, approved for publication on Aug. 17, 2018 (hereafter "SEMI S2-0818"). In accordance with certain examples, the passthrough 26 may be elevated above the floor 12 by about 1.2 meters (about 4 feet). It is contemplated that the trolley-mounted hoist 32 may include a manual hoisting mechanism, e.g., a crank-operated hoisting mechanism.

As has been explained above, work in elevated workspaces may be accompanied by the risk of injury due to falls. For example, technicians working in the elevated workspace 24 may risk injury in the event of fall from the top of the wafer handling chamber 14. Technicians working on the elevated workspace 24 may also risk injury when installing and/or removing the wafer handler module 16 from the wafer handling chamber 14. And technicians working on the elevated workspace 24 may further risk injury when transferring the wafer handling module to and from and the semiconductor processing system 10 through the passthrough 26. To limit (or eliminate) risk of injury due to fall during one or more of these tasks, the semiconductor processing system 10 includes the gate/barrier assembly 100.

Figure 3:
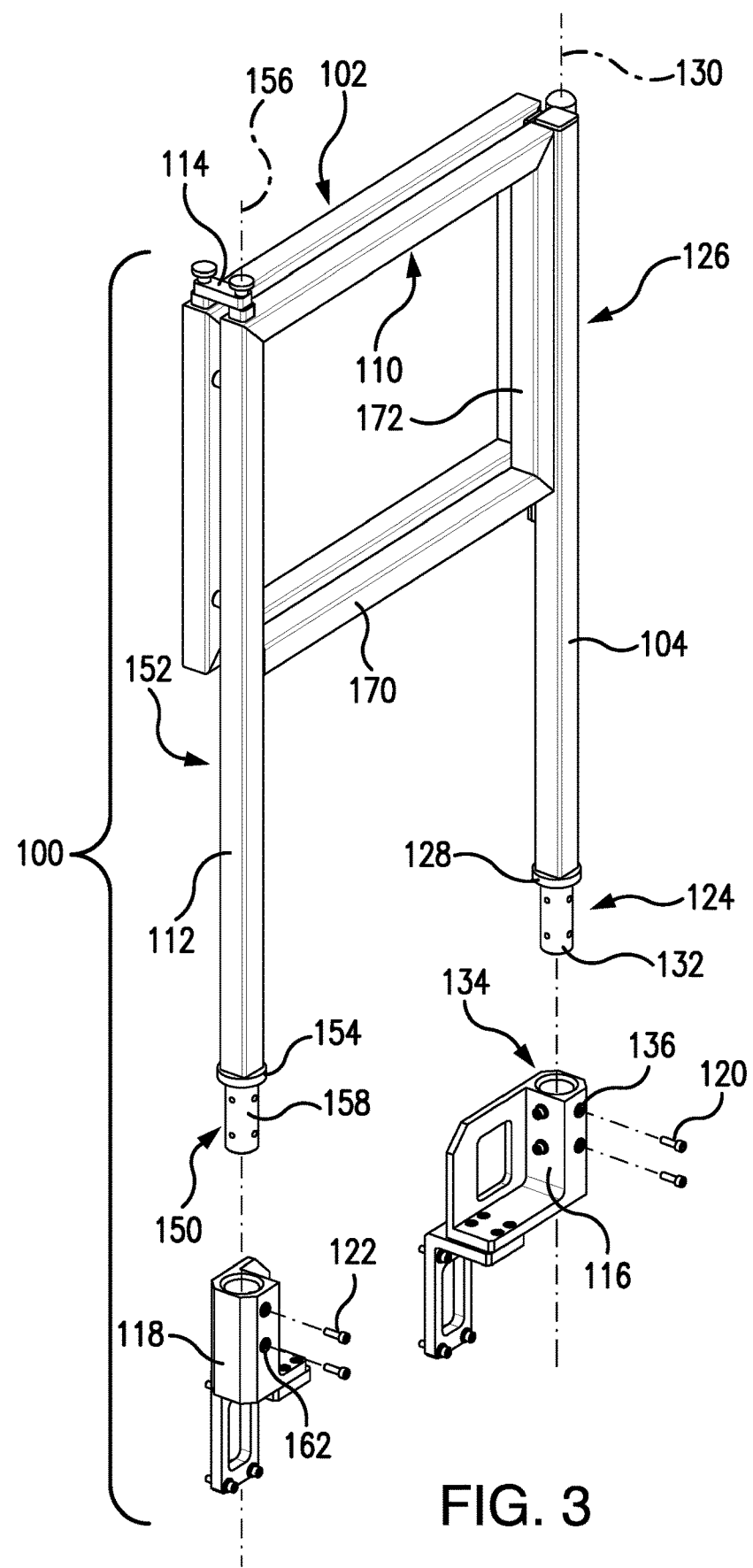
FIG. 3 is a perspective view of the gate/barrier assembly of FIG. 1 looking toward the gate/barrier assembly from outboard of the semiconductor processing system, showing the gate pivotably supported by a first post and the barrier fixedly supported by a second post.

With reference to FIG. 3, the gate/barrier assembly 100 is configured for placement of at least one (or both) of a barrier 110 (shown in FIG. 3) and a gate 102 (shown in FIG. 4) in the passthrough 26 to prevent (or eliminate entirely) risk of fall from the elevated workspace 24 through the passthrough 26. In this respect the gate/barrier assembly 100 includes the gate 102, a first post 104, a hinge 106 (shown in FIG. 4) and a biasing member 108 (shown in FIG. 4). As also shown in FIG. 3, the gate/barrier assembly 100 also includes the barrier 110, a second post 112 and a latch member 114. As further shown in FIG. 3, the gate/barrier assembly 100 further includes a first bracket 116, a second bracket 118, a plurality of first post fasteners 120 and a plurality of second post fasteners 122.

The first post 104 has a first post lower portion 124, a first post upper portion 126 and a first post flange 128. The first post lower portion 124, the first post upper portion 126, and the first post flange 128 are each arranged along a first post axis 130. The first post flange 128 extends about the first post 104 and the first post axis 130, separates the first post lower portion 124 from the first post upper portion 126, and is configured for seating against the first bracket 116. The first post lower portion 124 extends upwards from the first post flange 128, i.e., in a direction axially opposite the first post upper portion 126, defines therein a plurality of first post threaded apertures 132, and is configured to seat in the first bracket 116. The plurality of first post threaded apertures 132 are axially spaced from one another along the first post axis 130 at a common circumferential position about the first post axis 130 for fixing the first post 104 to the first bracket 116.

The first bracket 116 is configured for fixation to the semiconductor processing system 10 (shown in FIG. 1). More specifically, the first bracket 116 is configured to fix the first post 104 to the semiconductor processing system 10 at a location below the passthrough 26 (shown in FIG. 2) such that the first post 104 laterally bounds the passthrough 26. In this respect the first bracket 116 is connected to the wafer handling chamber 14 below the passthrough 26, defines therein a first bracket socket 134, and has a plurality of first bracket fastener apertures 136. The plurality of first bracket fastener apertures 136 extend through the first bracket 116 to the first bracket socket 134 and are configured to receive therethrough the plurality of first post fasteners 120 for fixation of the first post 104 to the first bracket 116.

The first post lower portion 124 is slidably received in the first bracket socket 134 such that the first post flange 128 seats against an upper surface of the first bracket 116. Seating the first post flange 128 against the upper surface of the first bracket 116 positions the first post threaded apertures 132 and the first bracket fastener apertures 136 at a common axial location about the first post axis 130. The common axial location facilitates assembly of the first post 104 in the first bracket 116 by registering the first bracket fastener apertures 136 with the first post threaded apertures 132, simplifying the insertion of the plurality of first post fasteners 120 through the plurality of first bracket fastener apertures 136 and seating within the plurality of first post threaded apertures 132. Threaded engagement of the plurality of first bracket fasteners 120 fixedly supports the first post 104 at the passthrough 26 (shown in FIG. 1) via the first bracket 116.

In certain examples, the number of first post fasteners 120 may be equivalent to the number first bracket fastener apertures 136. In accordance with certain examples, the number of first post fasteners 120 may be equivalent to the number of first post threaded apertures 132. It is also contemplated that, in certain examples, the number of first post fasteners 120 may be equivalent to both the number of first bracket fastener apertures 136 and the number of first post threaded apertures 132. As will be appreciated by those of skill in the art in view of the present disclosure, matching the number of fasteners with fastener apertures may errorproof assembly of the first post 104 in the first bracket 116 by limiting the installation to a single orientation about the first post axis 130. It is contemplated that, in certain examples, the first post lower portion 124 and first bracket socket may have a key portion and corresponding keyway portion to further simplify assembly of the gate/barrier assembly 100 on the semiconductor processing system 10.

Figure 4:
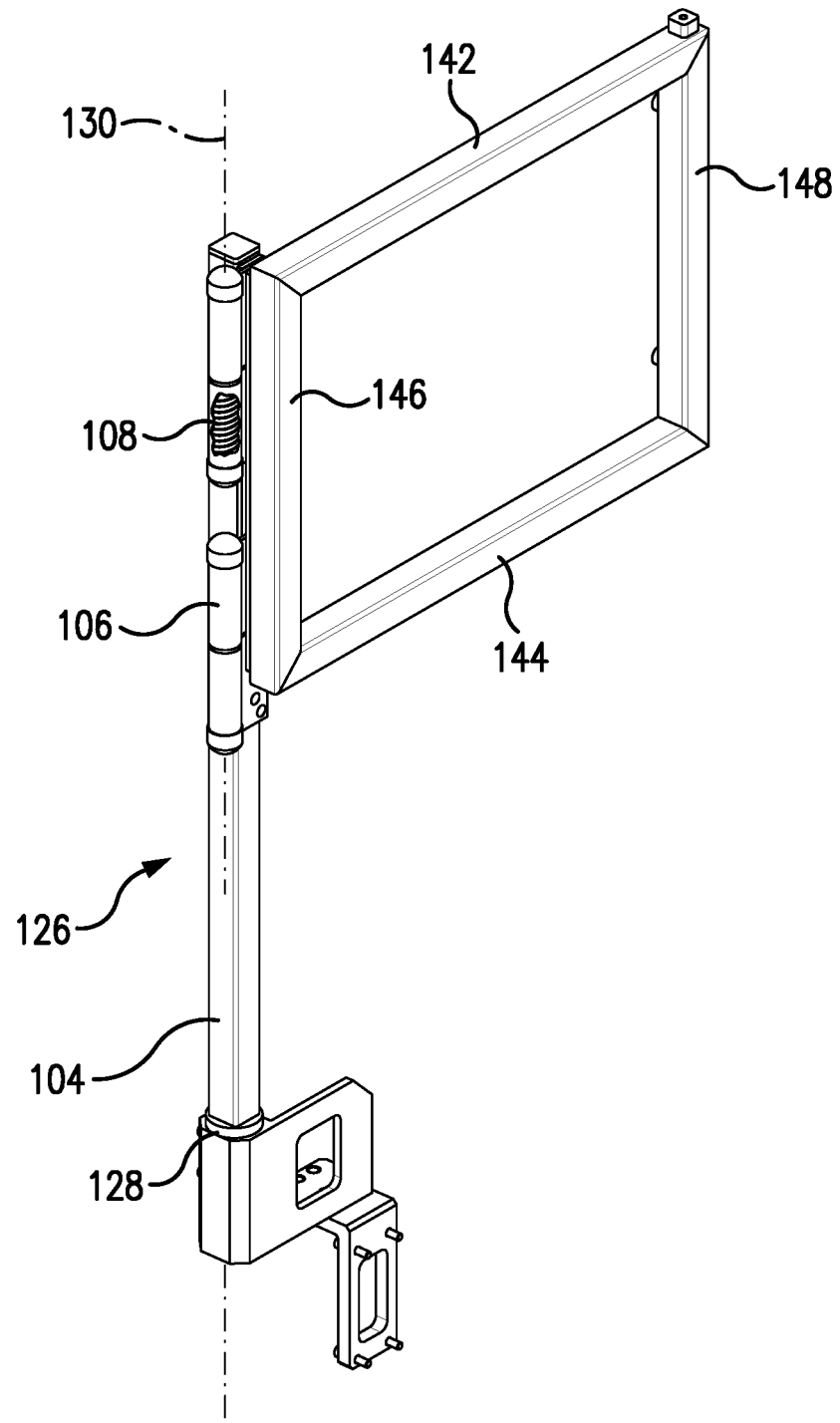
FIG. 4 is a perspective view of the gate/barrier assembly of FIG. 1 looking toward the gate/barrier assembly from inboard of the semiconductor processing system, showing a hinge connecting the gate to the first post and a spring operatively connected to the gate.

With reference to FIG. 4, the first post upper portion 126 extends axially upwards from the flange 128 along the first post axis 130. The hinge 106 is connected to the first post upper portion 126 and couples the gate 102 to the first post 104. In this respect the hinge 106 pivotably fixes the gate 102 to the first post 104 along the first post upper portion 126 such that the gate 102 is pivotable relative to the first post 4 between an open position 138 (shown in FIG. 6) and a closed position 140 (shown in FIG. 2). In the open position 138, the gate 102 extends inboard from the passthrough 26, is spaced from the second post 112 and provides limited fall prevention protection. In the closed position 140, the gate 102 spans the passthrough 26, overlaps an inboard surface of the second post 112, and limits (or prevents entirely) risk of fall from the workspace 24 and through the passthrough 26.

The biasing member 108 is connected between the first post 104 and the gate 102 and is configured to exert a biasing force on the gate 102 urging the gate 102 toward the closed position 140 (shown in FIG. 2). As will be appreciated by those of skill in the art in view of the present disclosure, urging the gate 102 toward the closed position 140 enables the gate 102 to close automatically, limiting (or eliminating) risk of fall through the passthrough 26 by eliminating the need for a technician to mount the wafer handling chamber 14 and manually move the gate 102 to the closed position 140 while located on the elevated workspace 24. In certain examples, the biasing member 108 may include a spring, such as a coil spring. In accordance with certain examples, the biasing member 108 and the hinge 106 may be integrated as a single assembly, simplifying assembly and/or removal of the gate/barrier assembly 100 from the semiconductor processing system 10 (shown in FIG. 1). A fixation member, accessible from the floor 12 (shown in FIG. 1), may further be operably associated with the gate 102 to fix the gate 102 in the open position 138 (shown in FIG. 6).

The gate 102 may have a gate toprail 142, gate midrail 144, a gate first vertical member 146, and a gate second vertical member 148. The gate toprail 142 extends horizontally from the first post 104 and has a length substantially equivalent (or equivalent) to a width of the passthrough 26 (shown in FIG. 2). The gate midrail 144 similarly extends horizontally from the first post 104, also has a length substantially equivalent (or equivalent) to a width of the passthrough 26 and is further arranged in parallel with the gate toprail 142. The gate first vertical member 146 connects the gate toprail 142 to the gate midrail 144, is substantially orthogonal (or orthogonal) to both the gate toprail 142 and the gate midrail 144 and extends in parallel with the first post upper portion 126 of the first post 104. The gate second vertical member 148 connects the gate toprail 142 to the gate midrail 144, is substantially orthogonal (or orthogonal) to the gate toprail 142 and the gate midrail 144 and extends in parallel with the gate first vertical member 146, and is further horizontally spaced from the gate first vertical member 146 by both the gate toprail 142 and the gate midrail 144. It is contemplated that the hinge 106 may be connected to the gate first vertical member 146 to pivotably support the gate 102 with the first post 103. It is also contemplated that, in certain examples, the latch member 114 (shown in FIG. 3) may seat on (or be configured to removably engage) the gate second vertical member 148.

In certain examples, the gate midrail 144 may be spaced from the top of the wafer handling chamber 14 (shown in FIG. 1) by less than 500 millimeters (about 19.7 inches). In accordance with certain examples, the gate toprail 142 may be spaced from the gate midrail 144 by less than 500 millimeters (about 19.7 inches). As will be appreciated by those of skill in the art in view of the present disclosure, spacing the gate midrail 144 less than 500 millimeters (about 19.7 inches) from the top of the wafer handling chamber 14 (shown in FIG. 1), and the gate toprail 142 from the gate midrail 144 by less than 500 millimeters (about 19.7 inches), renders the semiconductor processing system 10 compliant with SEMI S2-0818 when the gate 102 is in the closed position 140 (shown in FIG. 2).

With continuing reference to FIG. 3, the second post 112 is similar to the first post 104 and in this respect has a second post lower portion 150, a second post upper portion 152 and a second post flange 154. The second post lower portion 150, the second post upper portion 152 and the second post flange 154 are each arranged along a second post axis 156. The second post flange 154 extends about the second post 112 and the second post axis 156 and separates the second post lower portion 150 from the second post upper portion 152. The second post lower portion 150 extends from the second post flange 154 downward, i.e., in a direction opposite the second post upper portion 152 and defines therein a plurality of second post threaded apertures 158. The second post upper portion 152 extends axially upwards from the second post flange 154, along the second post axis 156, and fixedly supports the barrier 110.

The barrier 110 has a barrier toprail 168, a barrier midrail 170, and a barrier vertical member 172. The barrier toprail 168 extends horizontally from the second post 112 to the barrier vertical member 172 and has a length substantially equivalent (or equivalent) to a width of the passthrough 26 (shown in FIG. 2). The barrier midrail 170 extends horizontally from the second post 112 to the barrier vertical member 172, has a length substantially equivalent (or equivalent) to the width of the passthrough 26, and further extends in parallel with the barrier toprail 168. The barrier vertical member 172 connects the barrier toprail 168 to the barrier midrail 170, is orthogonal relative to both the barrier toprail 168 and the barrier midrail 170 and extends in parallel with the second post 112. In certain examples, the latch member 114 may seat on (or be configured to removably engage) the barrier toprail 168. In accordance with certain examples, the latch member 114 may seats on (or is removably engaged) to the barrier at a location along the second post axis 156. As will be appreciated by those of skill in the art, this allows the gate 102 to be fixedly latched to the barrier 110 irrespective of the position of the barrier 110, e.g., when the barrier 110 is in a guard position 164 (shown in FIG. 2) wherein the barrier spans the passthrough 26 and a guide position 166 (shown in FIG. 7) wherein the barrier 110 extends from the passthrough 26.

In certain examples, the barrier midrail 170 may be spaced from the top of the wafer handling chamber 14 (shown in FIG. 1) by less than 500 millimeters (about 19.7 inches). In accordance with certain examples, the barrier toprail 168 may be spaced from the barrier midrail 170 by less than 500 millimeters (about 19.7 inches). As will be appreciated by those of skill in the art in view of the present disclosure, spacing (a) the barrier midrail 170 less than 500 millimeters (about 19.7 inches) from the top of the wafer handling chamber 14 (shown in FIG. 1), and (b) the barrier toprail 168 by less than 500 millimeters (19.7 inches) from the barrier midrail 170, renders the semiconductor processing system 10 (shown in FIG. 1) compliant with SEMI S2-0818 when the gate 102 is in the closed position 140 (shown in FIG. 2).

The second bracket 118 is configured to pivotably fix the second post 112 to the semiconductor processing system 10 (shown in FIG. 1). More specifically, the second bracket 118 is configured to fix the second post 112 to the semiconductor processing system 10 at a location below the passthrough 26 (shown in FIG. 1), laterally bounding the passthrough 26, and spaced from the first post 104 by the passthrough 26. In this respect the second bracket 118 is connected to the wafer handling chamber 14 (shown in FIG. 1) below the passthrough 26, defines therein a second bracket socket 160, and has a plurality of second bracket fastener apertures 162.

The second post lower portion 150 is slidably received in the second bracket socket 160 such that the second post flange 154 seats on top of the second bracket 118. Seating the second post flange 154 on the top the second bracket 118 positions the second post threaded apertures 158 and the second bracket fastener apertures 162 on common circumferences about the second post axis 156. Positioning the second post threaded apertures 158 and the second bracket fastener apertures 162 on common circumference allows the second post 112 (and thereby the barrier 110) to be pivoted in the second bracket 118 about the second post axis 156 to register different pairs of the second post threaded apertures 158 and the second bracket fastener apertures 162. For example, the second post 112 may pivoted to locate the either the guard position 164 (shown in FIG. 2) and the guide position 166 (shown in FIG. 7), and the second post 112 fastened to the second bracket 118 using the plurality of second post fasteners 122 to fix the barrier 110 in either the guard position 164 or the guide position 166.

In certain examples, two of the plurality of second post threaded apertures 158 may be circumferentially offset from one another about the second post axis 156 for fixation of the barrier 110 in to the second bracket 118 in both the guard position 164 and the guide position 166. In accordance with certain examples, two of the plurality of second bracket fastener apertures 162 may be circumferentially offset from one another about the second post axis 156 for fixation of the barrier 110 in to the second bracket 118 in both the guard position 164 (shown in FIG. 2) and the guide position 166 (shown in FIG. 7). It is contemplated that, in accordance certain examples, the plurality second bracket threaded apertures 162 may be greater than the plurality of second post fasteners 122 for pivotably fixing the barrier to the semiconductor processing system for moving the barrier between the guard position 164 and the guide position 166. It is further contemplated that the plurality second post threaded apertures 158 may be greater than the plurality of second post fasteners 122 to pivotably fix the barrier 110 to the semiconductor processing system 10 for movement of the barrier 110 between the guard position 164 and the guide position 166.

Referring now to FIGS. 5-9, a method 200 of removing and replacing module in a semiconductor processing system, e.g., the wafer handler module 16, is shown. As shown in FIG. 5, the gate 102 and the barrier 110 are first positioned in the passthrough 26 by moving the gate 102 and the barrier 110 to the closed position 140 and the guard position 164, respectively. Moving the gate 102 to the closed position 140 includes (a) pivoting the gate 102 about the first post 104 from open position 138, and (b) retaining the gate 102 in the passthrough 26 by overlapping the gate second vertical member 148 against an inboard surface of the second post 112, Moving the barrier 110 to the guard position 164 includes (c) removing the plurality of second post fasteners 122 from the second post 112; (d) pivoting the second post 112 (and thereby the barrier 110) about the second post axis 156, and (e) fixing the second post 112 in the second bracket 118 by threadedly seating the plurality of second post fasteners 122 in the second post 112 through the plurality of second bracket fastener apertures 162 in the second bracket 118.

Once the gate is moved to the closed position 140 and the barrier 110 moved to the guard position 164, the wafer handler module 16 is removed from the semiconductor processing system 10. Removal of the wafer handler module 16 may be accomplished by (f) sliding the trolley-mounted hoist 32 along the rail 30 to the inboard hoisting location 34, (g) removing covers from the wafer handling chamber 14 to access and rig the wafer handler module 16 for lifting, and (g) hoisting the wafer handler module 16 from the wafer handling chamber 14, e.g., by manipulating a crank operably associated with the trolley-mounted hoist 32. Optionally, the gate 102 may be fixed to the barrier 110 by (h) latching the gate 102 to the barrier 110 with the latch member 114 to prevent movement of the gate 102 from the closed position 140, e.g., in the event that the gate 102 is bumped during removal and/or movement of the wafer handler module 16. As will be appreciated by those of skill in the art in view of the present disclosure, moving the gate 102 to the closed position 140 positions the gate 102 in the passthrough 26. Positioning the gate 102 in the passthrough allows the gate/barrier assembly 100 to limit (or prevent) risk of fall from the workspace 24 through the passthrough 26.

Figure 6:
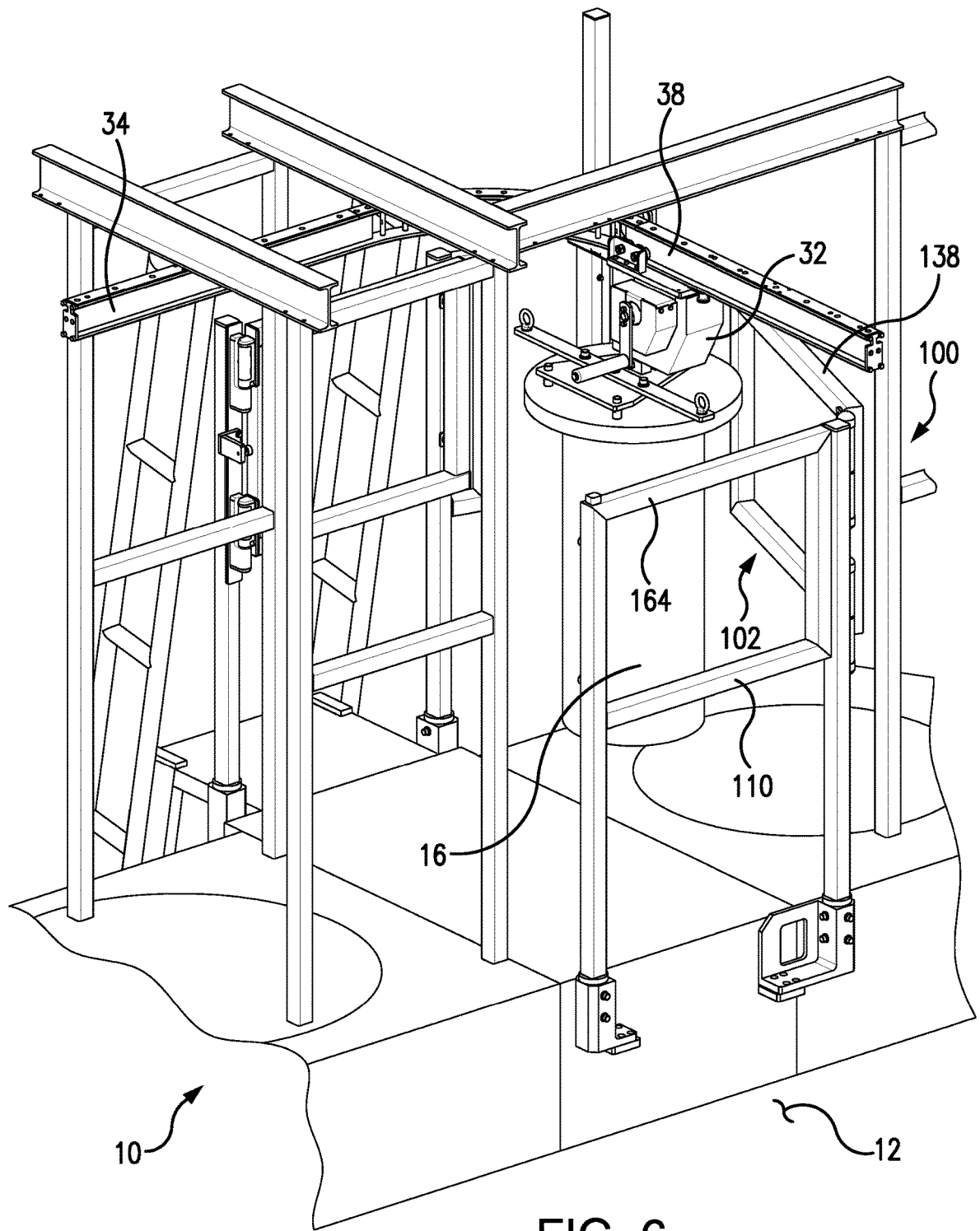
FIG. 6 is a perspective view of a portion of the semiconductor processing system of FIG. 1 including the gate/barrier assembly, showing the gate in an open position and the barrier in the guard position for movement of the wafer handler module to the passthrough.

As shown in FIG. 6, next, the wafer handler module 16 is readied for transfer through the passthrough 26. Readying the wafer handler for transfer through the passthrough 26 includes (a) moving the gate 102 to the open position 138 by pivoting the gate 102 about the first post 104 such that the gate 102 extends inboard from the passthrough 26, (b) fixing the gate 102 in the open position 138, and (c) moving the trolley-mounted hoist 32 (and thereby the wafer handler module 16) from the inboard hoisting location 34 to an inboard intermediate location 38 (shown in FIG. 2) adjacent the passthrough 26 and spaced from the outboard hoisting location by the passthrough 26. Fixation of the gate 102 in the open position 138 may be accomplished, for example, by (d) manipulating a catch mechanism 174 (shown in FIG. 7) positioned below the biasing member 108 and operably associated with the gate 102. Optionally, movement of the gate 102 to the open position 138 may be preceded by (e) disengaging the latch member 114 from one of the gate 102 and the barrier 110 to unfix the gate 102 from the barrier 110. Notably, as the barrier 110 remains the guard position 164 during these operations, the gate/barrier assembly 100 also limits (or eliminates) risk of fall from the workspace 24 through the passthrough 26 during these operations.

Figure 7:
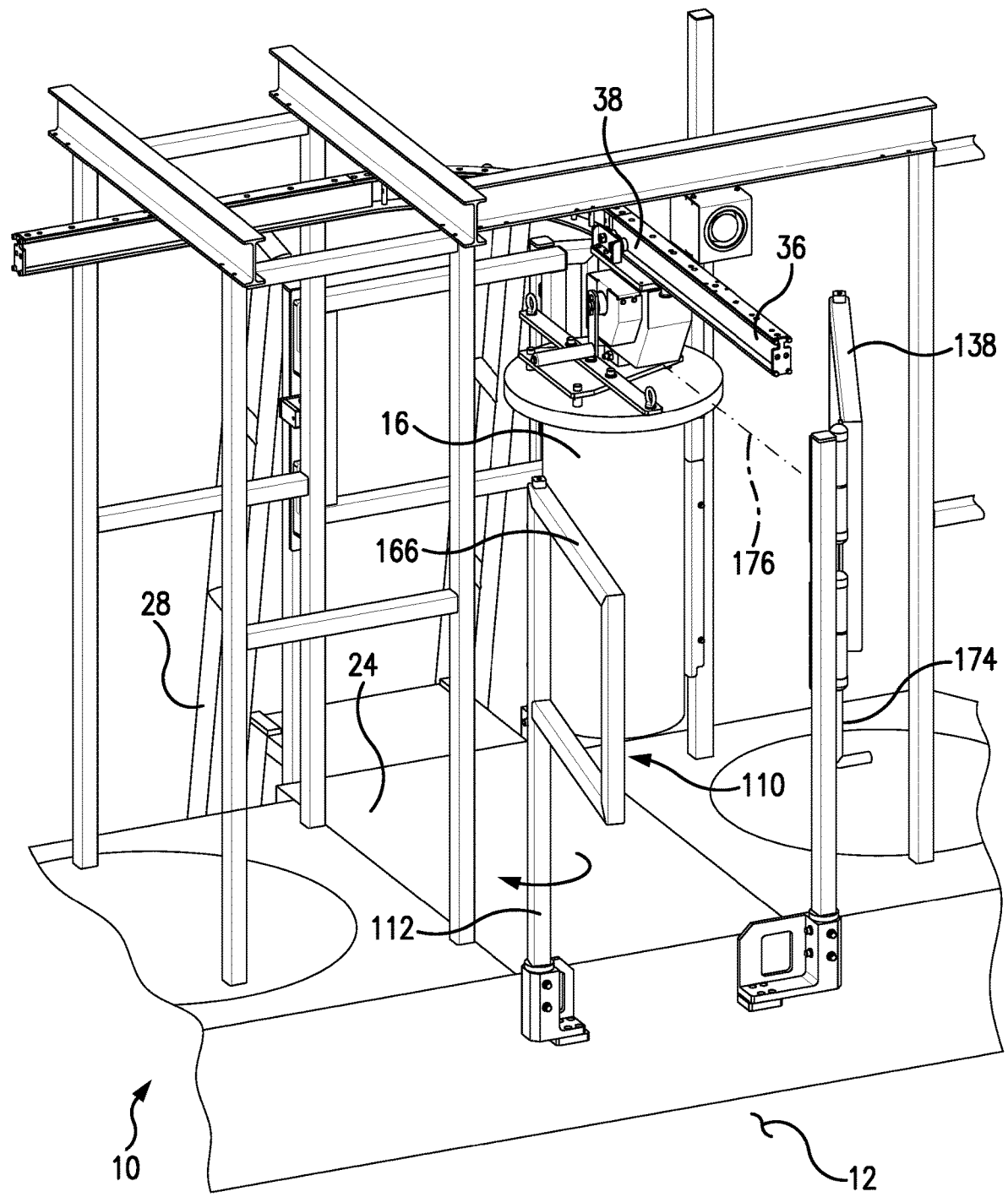
FIG. 7 is a perspective view of a portion of the semiconductor processing system of FIG. 1 including the gate/barrier assembly, showing the barrier in a guide position while the gate remains in the open position in preparation for transfer of the wafer handler module through the passthrough to an outboard hoisting location.

As shown in FIG. 7, the barrier 110 is thereafter moved to the guide position 166. Moving the barrier 110 to the guide position 166 includes (a) unfixing the second post 112 from the semiconductor processing system 10 by removing the plurality of second post fasteners 122 (shown in FIG. 3) from the second post 112 and the second post bracket 118, (b) pivoting the second post 112 (and thereby the barrier 110) the second post axis 156 (shown in FIG. 3) such that the barrier 110 extends outboard from the passthrough 26, and (c) fixing the second post 112 to the semiconductor processing system 10 by seating the plurality of second post fasteners 122 in the second post threaded apertures 158 through the second bracket fastener apertures 162 of the second post bracket 118. Notably, these operations may be accomplished from the floor 12.

In the guide position 166 the barrier 110 is spaced from the first post 104 such that the barrier 110 extends from the passthrough 26 in an outboard direction. Notably, as plurality of second post fasteners 122 are seated in the second post bracket 118 at a location below the passthrough 26, are therefore accessible from a technician located on the floor 12, the gate/barrier assembly 100 further limits (or eliminates entirely) risk of fall from the workspace 24 through the passthrough 26 during movement of the barrier 110 to the guide position 166.

Figure 8:
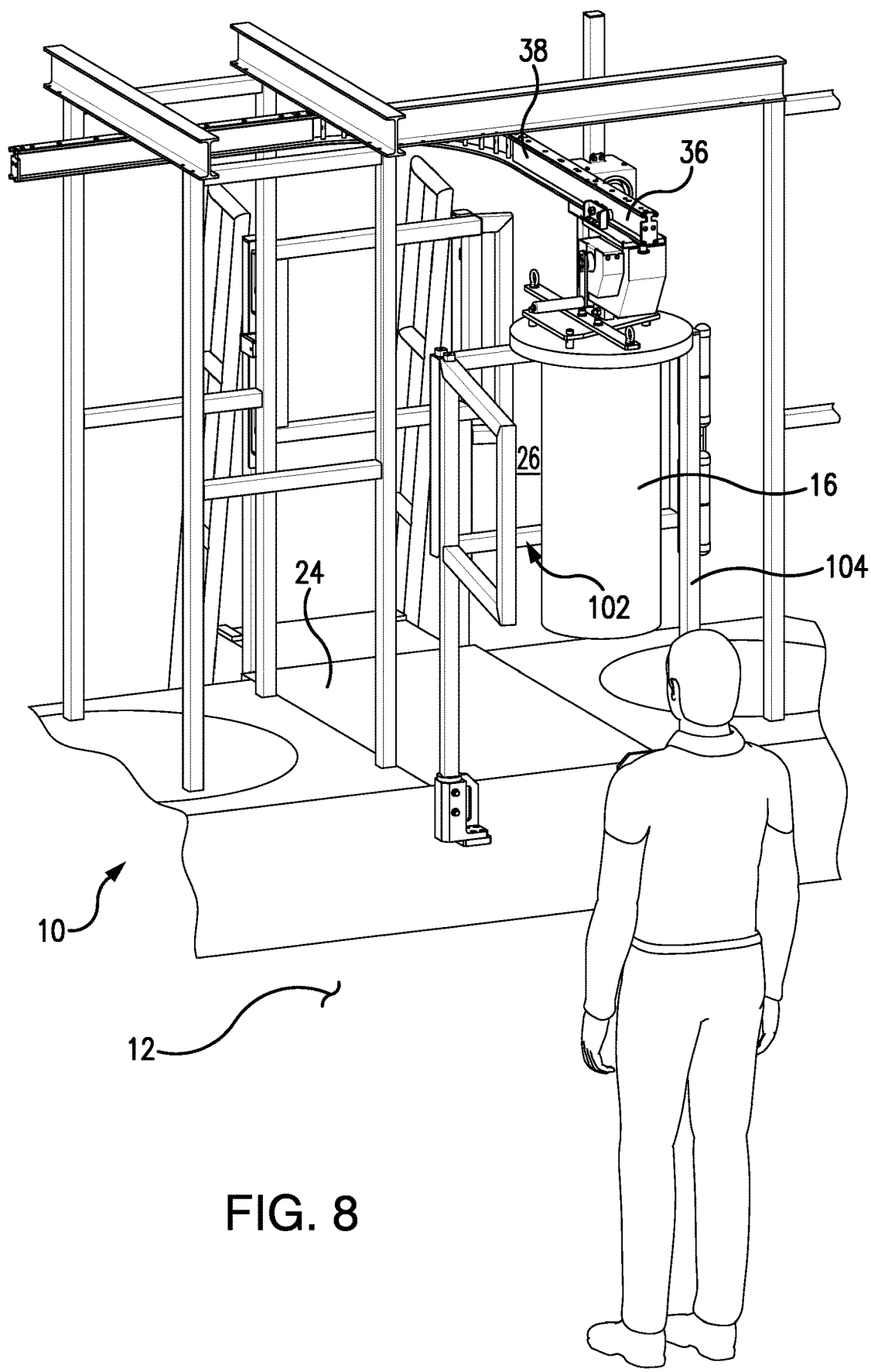
FIG. 8 is a perspective view of a portion of the semiconductor processing system of FIG. 1 including the gate/barrier assembly, showing the gate automatically moving to the closed position as a technician on the floor adjacent to the passthrough transfers the wafer handler module to the outboard hoisting location.

As shown in FIG. 8, next, the wafer handler module 16 is transferred through the passthrough 26. Transfer of the wafer handler module 16 through the passthrough is accomplished by moving the gate 102 from the open position 138 (shown in FIG. 7) to an intermediate position 176 (shown in FIG. 7) located between the open position 138 and the closed position 140 (shown in FIG. 2) by pivoting the gate 102 about the first post 104. The wafer handler module 16 is then moved the passthrough 26 from the inboard intermediate location 38 adjacent to the passthrough 26 to the outboard hoisting location 36. Notably, as the wafer handler module 16 moves through the passthrough 26, the gate 102 moves from the intermediate position 176 to the closed position 140. It is contemplated that movement of the gate 102 to the closed position 140 occur automatically, i.e., without manipulation by a technician, the gate/barrier assembly 100 thereby limiting (or eliminating) risk without requiring a technician to first position the gate 102 in the closed position 140.

Optionally, moving the gate 102 from the open position 138 to the intermediate position 176 may include (d) releasing the catch mechanism 174 (shown in FIG. 7), the gate 102 thereby being supported in the intermediate position 176 by the wafer handler module 16. So supported, the biasing force exerted by the biasing member 108 (shown in FIG. 3) drives the wafer handler module 16 through the passthrough 26 by the engagement of the gate 102 against the wafer handler module 16. Alternatively, moving the gate 102 from the open position 138 to the intermediate position 176 may include (e) manipulating the wafer handler module 16 by a technician on the floor 12 to move between the inboard intermediate location 38 adjacent to the passthrough 26 and the outboard hoisting location 36. Notably, as transfer of the wafer handler module 16 may be accomplished from the floor 12, the gate/barrier assembly 100 also limits (or eliminates) risk of fall from the workspace 24 through the passthrough 26 during transfer of the wafer handler module 16 through the passthrough 26.

Figure 9:
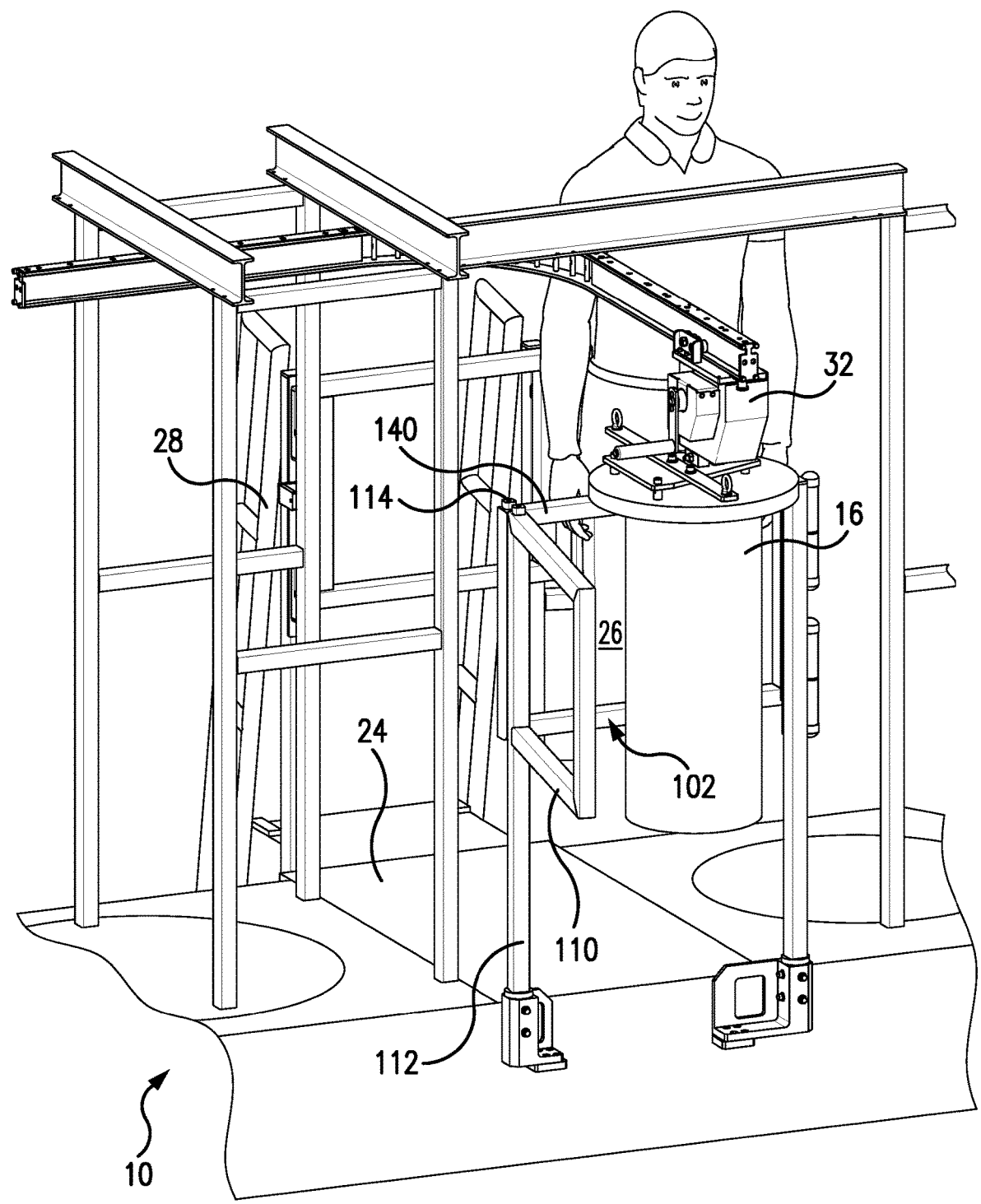
FIG. 9 is a perspective view of a portion of the semiconductor processing system of FIG. 1 including the gate/barrier assembly, showing a technician lowering the wafer handler module from the semiconductor processing system from the elevated workspace while the gate remains in the closed position and the barrier remains in the guide position.

As shown in FIG. 9, the wafer handler module 16 is thereafter lowered from the outboard hoisting location 36. Lowering the wafer handler module 16 from the outboard hoisting location 36 includes (a) mounting the staircase 28 to access the workspace 24, (b) fixing the gate 102 to the barrier 110 with the latch member 114, and (c) lowering the wafer handler module 16 by manipulating the crank operably associated with the trolley-mounted hoist 32. As will be appreciated by those of skill in the art in view of the present disclosure, replacement of the wafer handler module 16 in the semiconductor processing system 10 may be accomplished by reversing the operations shown in FIGS. 5-9 while also limiting (or preventing entirely) risk of fall from the workspace 24 through the passthrough 26.

With reference to FIGS. 10 and 11, a gate/barrier assembly 300 is shown. The gate/barrier assembly 300 is similar to the gate/barrier assembly 100 (shown in FIG. 1) and additionally includes a gate 302 with an inboard portion 304 and an outboard portion 306. The outboard portion 304 is movable relative to the inboard portion 304 between an extended position 308 (shown in FIG. 10) and a folded position 310 (shown in FIG. 11), the outboard portion 306 abutting the inboard portion 304 in the in extended position 308, the outboard portion 306 overlaying the inboard portion 304 in the folded position 310. As will be appreciated by those of skill in the art in view of the present disclosure, moving the outboard portion 306 of the gate 302 to the folded position 310 limits intrusion of the gate 302 into the workspace 24 when the gate is in the open position 138 while providing the aforementioned advantages with respect to fall protection. Limiting intrusion of the gate 302 into the workspace 24 in turn allows for removal of relatively large structures from the semiconductor processing system 10 (shown in FIG. 1), for example chamber lid 42 enclosing the second wafer handler module 40, eliminating the need to stow such structures in situ, e.g., within the workspace 24, during removal and/or replacement of the second wafer handler module 40.

With reference to FIG. 12, a method 200 of removing and replacing a module in a semiconductor processing system, e.g., the wafer handler module 16 (shown in FIG. 5), is shown. As shown with box 202, the method 200 includes moving a gate of a gate/barrier assembly to a closed position, e.g., the gate 102 (shown in FIG. 3) to the closed position 140 (shown in FIG. 2). The method 200 also includes moving a barrier of the gate/barrier assembly to a guard position, e.g., the barrier 110 (shown in FIG. 2) to the guard position 164 (shown in FIG. 5), as shown with box 204. It is contemplated that the gate may be fixed to the barrier once in the closed position using a latch member, e.g., the latch member 114 (shown in FIG. 3), as shown with box 206. It is also contemplated that gate may be moved to the closed position and/or fixed to the barrier while an elevated workspace of the semiconductor processing system, e.g., the elevated workspace 24 (shown in FIG. 2), is occupied by a technician, as shown with box 208.

As shown with box 208, a module, e.g., the wafer handler module 16 (shown in FIG. 5), is next hoisted from the semiconductor processing system at an inboard hoisting location, e.g., the inboard hoisting location 34. Hoisting the module may be accomplished by moving a trolley-mounted hoist to the inboard hoisting location, e.g., the trolley-mounted hoist 32, removing covers from the wafer handling chamber housing the module, e.g., from the wafer handling chamber 14 (shown in FIG. 1). Hoisting may be accomplished while by a technician occupying the elevated workspace, such as by manipulating a crank operably connected to the hoist.

In certain examples, hoisting the wafer handler module may include removing a chamber lid, e.g., the chamber lid 42 (shown in FIG. 11), from the semiconductor processing system. The gate may then be moved to the open position and folded. Folding may be accomplished by moving an outboard portion of the gate, e.g., from the outboard position 308 (shown in FIG. 11) to the inboard position 310 (shown in FIG. 11). Once the gate is folded, the lid may be removed from the semiconductor processing system by shifting the lid through a space occupied by the outboard portion while previously in the extended position.

As shown with box 212, next, the gate of the gate/barrier assembly is moved from the closed position to an open position, e.g., the open position 138 (shown in FIG. 6). In certain examples, the moving the gate to the open position may include unfixing the gate from the barrier. In accordance with certain examples, moving the gate to the open position may be accomplished by a technician occupying the elevated workspace. In such examples the barrier provides fall protection to the technical while the technician unfixes the gate from the barrier and/or moves the gate from the closed position to the open position. The module is thereafter transferred from the inboard hoisting location to an inboard intermediate location adjacent to the passthrough, e.g., the inboard intermediate location 38 (shown FIG. 6), as shown with box 214. It is contemplated that the transfer be accomplished by a technician occupying the elevated workspace, and that the barrier provide fall protection to the technician during the transfer.

As shown with box 216, the barrier is next moved from the guard position 164 to a guide position, e.g., the guide position 166 shown in FIG. 7). It is contemplated that the barrier be moved to the guide position by pivoting a second post of the gate/barrier assembly, e.g., the second post 112 (shown in FIG. 3), about a second post axis, e.g., the second post axis 156 (shown in FIG. 3), and while seated in a second bracket, e.g., the second bracket 118 (shown in FIG. 3). Pivoting second post pivots the barrier about the second post axis. Advantageously, as the barrier is fixed relative to the second post, the barrier may be moved from the guard position to the guide position from the floor, limiting (or eliminating) risk of fall through the passthrough once barrier moves from the guard position. In certain examples, the barrier is moved from the guard position to the guide position while the elevated workspace is unoccupied, as shown with box 218.

As shown with box 220, the module is next transferred through the passthrough to an outboard hoisting location, e.g., the outboard hoisting location 36 (shown in FIG. 2), from the inboard intermediate location. As the module traverses the passthrough the gate moves automatically from the open position to the closed position, as shown with box 222, e.g., by operation of a biasing member configured to urge the gate toward the closed position, e.g., the biasing member 108 (shown in FIG. 4). In certain examples, the elevated workspace may by unoccupied as the module traverses the passthrough, e.g., by employment of a lanyard attached to the trolley-mounted hoist and accessible by a technician positioned on the floor adjacent the passthrough. The module is thereafter lowered from the semiconductor processing system at the outboard hoisting location, e.g., by operation of the crank operably connected to the trolley-mounted hoist, as shown with box 222. In certain examples, lowering may be accomplished by a technician occupying the elevated workspace, fall protection provided by prior automatic movement of the gate to the closed position, as shown with box 224.

The particular implementations shown and described are illustrative of the present disclosure and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

ELEMENT LISTING

10 Semiconductor Processing System
12 Floor
14 Wafer handling chamber
16 Wafer Handler Module
18 First Processing Module
20 Second Processing Module
22 Gate Valve
24 Workspace
26 Passthrough
28 Staircase
30 Rail
32 Trolley-Mounted Hoist
34 Inboard Hoisting Location
36 Outboard Hoisting Location
38 Inboard Intermediate Location
40 Second Wafer Handler Module
42 Chamber Lid
100 Gate/Barrier Assembly
102 Gate
104 First Post
106 Hinge
108 Biasing Member
110 Barrier
112 Second Post
114 Latch Element
116 First Bracket
118 Second Bracket
120 Plurality of First Post Fasteners
122 Plurality of Second Post Fasteners
124 First Post Lower Portion
126 First Post Upper Portion
128 First Post Flange
130 First Post Axis
132 First Post Threaded Apertures
134 First Bracket Socket
136 First Bracket Fastener Apertures
138 Open Position (gate)
140 Closed Position (gate)
142 Gate Toprail
144 Gate Midrail
146 Gate First Vertical Member
148 Gate Second Vertical Member
150 Second Post Lower Portion
152 Second Post Upper Portion
154 Second Post Flange
156 Second Post Axis
158 Second Post Threaded Apertures
160 Second Bracket Socket
162 Second Bracket Fastener Apertures
164 Guard Position (Barrier)
166 Guide Position (Barrier)
168 Barrier Toprail
170 Barrier Midrail
172 Barrier Vertical Member
174 Catch Mechanism
176 Intermediate Position
200 Method
202 Box
204 Box
206 Box
208 Box
210 Box
212 Box
214 Box
216 Box
218 Box
220 Box
222 Box
300 Gate/Barrier Assembly
302 Gate
304 Inboard Portion
306 Outboard Portion
308 Extended Position
310 Folded Position

The invention claimed is:

1. A gate/barrier assembly for a semiconductor processing system, comprising:
a first post configured to be fixedly supported by the semiconductor processing system;
a second post extending in parallel with the first post and configured to be pivotably supported by the semiconductor processing system;
a gate pivotably supported by the first post and having a closed position and an open position, the gate overlapping the second post in the closed position, the gate spaced from the second post in the open position; and
a barrier fixedly supported by the second post and having a guard position and a guide position, the barrier abutting the first post in the guard position, the barrier spaced from first post in the guide position;

wherein the gate overlaps the barrier when the gate is in the closed position and the barrier is in the guard position.

2. The gate/barrier assembly of claim 1, further comprising a biasing member arranged between the gate and the first post, the biasing member urging the gate toward the closed position to automatically move the gate between the closed position and the open position.

3. The gate/barrier assembly of claim 1, wherein the first post has a first post flange extending about the first post to fixedly support the first post adjacent to a passthrough of the semiconductor processing system.

4. The gate/barrier assembly of claim 1, wherein the second post has a second post flange extending about the second post to pivotably support the second post opposite the first post, the second post spaced from the first post by a passthrough of the semiconductor processing system.

5. The gate/barrier assembly of claim 1, wherein the gate comprises:
   a gate midrail extending horizontally relative to the first post and spaced from a wafer handling chamber of the semiconductor processing system by less than 500 millimeters (about 19.7 inches); and
   a gate toprail extending in parallel with the gate midrail, the gate toprail spaced from the gate midrail by less than 500 millimeters (about 19.7 inches).

6. The gate/barrier assembly of claim 1, wherein the gate comprises:
   an inboard portion pivotably supported by the first post;
   an outboard portion pivotably supported by the inboard portion of the gate and therethrough by the first post;
   wherein the outboard portion of the gate an extended position and a folded position;
   wherein the outboard portion of the gate abuts the inboard portion of the gate in extended position; and
   wherein the outboard portion of the gate overlays the inboard portion of the gate in the folded position.

7. The gate/barrier assembly of claim 1, wherein the barrier comprises:
   a barrier midrail fixed to the second post and extending horizontally from the second post, the barrier midrail from a wafer handling chamber of the semiconductor processing system by less than 500 millimeters (about 19.7 inches); and
   a barrier toprail fixed to the second post and extending in parallel with the barrier midrail, wherein the barrier toprail and the barrier midrail are spaced from one another by less than 500 millimeters (about 19.7 inches).

8. The gate/barrier assembly of claim 1, further comprising:
   a first bracket fixed to the semiconductor processing system and defining therein a plurality of first bracket fastener apertures; and
   a plurality of first post fasteners extending through the plurality of first bracket fastener apertures and fixing the first post to the first bracket.

9. The gate/barrier assembly of claim 1, further comprising:
   a second bracket fixed to the semiconductor processing system and defining therein a plurality of second bracket fastener apertures; and
   a plurality of second post fasteners extending through the plurality of second bracket fastener apertures and fixing the second post to the second bracket.

10. The gate/barrier assembly of claim 9, wherein the plurality of second bracket fastener apertures is greater than the plurality of second post fasteners for pivotably fixing the barrier to the semiconductor processing system for moving the barrier between the guard position and the guide position.

11. The gate/barrier assembly of claim 9, wherein the plurality of second post threaded apertures is greater than the plurality of second post fasteners for pivotably fixing the barrier to the semiconductor processing system for moving the barrier between the guard position and the guide position.

12. The gate/barrier assembly of claim 1, further comprising a latch member fixed to one of the barrier and the gate to fix the gate to the barrier when the gate is in the closed position.

13. The gate/barrier assembly of claim 1, wherein the gate overlaps the second post in the closed position.

14. The gate/barrier assembly of claim 1, wherein the gate is fixed to the barrier when the barrier is in the guard position, wherein the gate is fixed to the barrier when the barrier is in the guide position.

15. The gate/barrier assembly of claim 1, further comprising:
   a hinge connecting the gate to the first post;
   a biasing member arranged between the gate and the first post, the biasing member configured to urge the gate toward the closed position; and
   a catch mechanism operably associated with the hinge and configured to retain the gate in the open position.

16. A semiconductor processing system, comprising:
   a wafer handling chamber positioned above a floor with a workspace and a passthrough, wherein the workspace and the passthrough are elevated relative to the floor;
   a wafer handler module housed within the wafer handling chamber; and
   a gate/barrier assembly as recited in claim 1, wherein the first post is fixed to the wafer handling chamber, wherein the second post is pivotably fixed to the wafer handling chamber and spaced from the first post by the passthrough,
   wherein the gate spans the passthrough in the closed position, and wherein the barrier spans the passthrough in the guard position.

17. The semiconductor processing system of claim 16, wherein the gate extends inboard from the passthrough in the open position, wherein the barrier extends outboard from the passthrough in the guide position.

18. The semiconductor processing system if claim 16, further comprising:
   a staircase connected to the wafer handling chamber to provide access to the workspace from the floor;
   a rail extending above the wafer handling chamber and supported by the wafer handling chamber; and
   a trolley-mounted hoist slidably disposed along the rail, wherein the rail extends above the passthrough between an inboard hoisting location and an outboard hoisting location for transfer of a wafer handler module to and from the workspace.

19. A method of removing and replacing a module in a semiconductor processing system, the method comprising:
   at a semiconductor processing system having a gate/barrier assembly including a first post fixed to the semiconductor processing system; a second post extending in parallel with the first post and pivotably fixed to the semiconductor processing system; a gate pivotably supported by the first post with a closed position and an open position, the gate spaced from the second post in the open position, the gate overlapping the second post in the closed position; and a barrier fixedly supported by the second post with a guide position and a guard position, the barrier spaced from the first post in the guide position, the barrier abutting the first post in the guard position, and the barrier overlapping the barrier when the gate is in the closed position and the barrier is in the guard position;

hoisting a wafer handler module from the semiconductor processing system;

moving the gate to the open position;

moving the barrier to the guide position; and transferring the wafer handler module through a passthrough of the semiconductor processing system, wherein the gate automatically moves to the closed position as the wafer handler module traverses the passthrough.

20. The method of claim 19, further comprising:

fixing the gate to the barrier while the gate is in the closed position and the barrier is in the guide position; and moving the gate from the open position by releasing a catch mechanism operably associated with the gate.

\* \* \* \* \*

UNITED STATES PATENT AND TRADEMARK OFFICE
CERTIFICATE OF CORRECTION

| | | |
|---|---|---|
| PATENT NO. | : 12,404,120 B2 | Page 1 of 1 |
| APPLICATION NO. | : 17/577634 | |
| DATED | : September 2, 2025 | |
| INVENTOR(S) | : Daisuke Ito | |

It is certified that error appears in the above-identified patent and that said Letters Patent is hereby corrected as shown below:

In the Claims

Column 17 Claim 6, Line 6 after the word "gate," add --comprises--.

Signed and Sealed this
Twenty-eighth Day of October, 2025

John A. Squires
*Director of the United States Patent and Trademark Office*